(12) United States Patent
Chen

(10) Patent No.: US 6,599,768 B1
(45) Date of Patent: Jul. 29, 2003

(54) SURFACE MOUNTING METHOD FOR HIGH POWER LIGHT EMITTING DIODE

(75) Inventor: Tzer-Perng Chen, Hsinchu (TW)

(73) Assignee: United Epitaxy Co., Ltd., Hsinchu (TW)

(*) Notice: Subject to any disclaimer, the term of this patent is extended or adjusted under 35 U.S.C. 154(b) by 0 days.

(21) Appl. No.: 10/223,244

(22) Filed: Aug. 20, 2002

(51) Int. Cl.[7] .................. H01L 21/00; F21V 21/00
(52) U.S. Cl. .................. 438/22; 438/106; 438/82; 438/98; 362/249
(58) Field of Search .................. 438/82, 85, 88, 438/93, 98, 99, 50, 64, 69, 106, 110, 112, 22, 24, 23, 25, 113; 362/249

(56) References Cited

U.S. PATENT DOCUMENTS 6,130,111 A * 10/2000 Ikuina et al. .............. 438/106
6,187,610 B1 * 2/2001 Armezzani et al. ......... 438/106
6,345,903 B1 * 2/2002 Koike et al. ............... 362/249

* cited by examiner

Primary Examiner—Wael Fahmy
Assistant Examiner—(Vikki) Hoa B. Trinh
(74) Attorney, Agent, or Firm—Troxell Law Office PLLC (57) ABSTRACT

Disclosed herein is a surface mounting method for high power output light emitting diode (LED). In the first preferred embodiment, the LED is mounted onto a thermal & electrical base-substrate, which has a plurality of trenches formed therein and filled with an insulating layer to isolate two parts of the base-substrate. A reflective frame assembler having a plurality of reflective frame is then adhered to the upper surface of the base-substrate. Each of them is for placing one LED chip. After a LED is with its two electrodes placed on a pair of the first metal contacts, the transparent resin or epoxy is refilled into reflective frame to seal the LED chip. In the second preferred embodiment, the LED is with two electrodes on the different side. Hence the LED is mounted on one metal contact only, the other electrode is in terms of a wire to bond to the other metal contact.

16 Claims, 7 Drawing Sheets

SURFACE MOUNTING METHOD FOR HIGH POWER LIGHT EMITTING DIODE

BACKGROUND OF THE INVENTION

1. Field of the Invention

The present invention relates to a light emitting device, and more particularly to a chip-type package for high power III-V compound semiconductor light emitting diodes.

2. Description of the Prior Art

Figure 1:
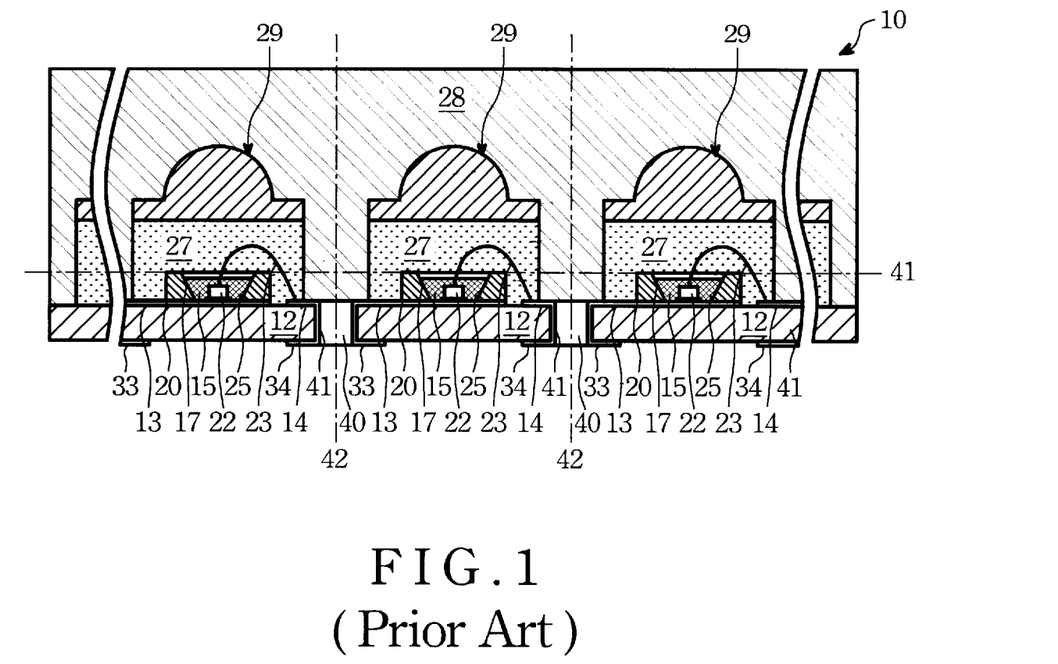
FIG. 1 shows a schematic view of a structure of a surface mount light emitting diode, which has two electrode formed on different sides according to prior art.

A first explanatory conventional chip-type light emitting diode (LED) device is disclosed in U.S. Pat. No. 6,345,903 B1. FIG. 1. herein shows a structure of the light emitting assembler 10 the patent disclosed. The LED 22 having an electrode formed on the bottom surface is adhered to a first metal contact 13 by silver paste or a solder layer 20. The other electrode of the LED chip 22 formed on the upper surface thereof is bonded to the other first metal electrode 14 by a conductive wire 23. Both of the first metal contacts 13, 14 are formed on an upper surface of a glass fiber substrate 12 and are connected to the second metal contacts 33, 34 on the bottom surface thereof by though holes 40, which have a conductive plating layer 41 formed thereon.

Enclosing each of the LED chips is a corresponding reflective frame 17 in a form of a reflective frame assembler. The reflective frame 17 has an inclined inner periphery surface in a conic form, which has the function to reflect the light emitted by the LED chip thereby causing the light to converge in an upward direction. A first transparent resin encapsulating layer 15 is then refilled the reflective frame 17 so as to protect the LED chip 22 and the conductive bonding wire 23.

Above the first resin encapsulator 15 is a second resin encapsulator 27 formed by injecting the resin into a mask mold 28 which has a plurality of semi-sphere concaves formed therein so as to form lens 29 for converging the light. After the resin encapsulator is cured, the mask mold 28 is then removed (not shown). Finally the LED assemble substrate is then saw from the cut line 42, which is along the center line of the through hole 40.

The surface mounted of the LED package in the first embodiment is for LED chip having two electrodes, respectively, on the upper and bottom surface. Thus, the light emitted is blocked by the upper electrode. Moreover, the base substrate 12 is an insulator, so that a through hold plating layer 41 is demanded to connect the first metal contacts 13, 14 on the upper surface and the second metal contacts 33, 34 on the bottom surface. The heat irradiated by the LED 22 can only be dissipated through the metal contacts 13, 33, and the through hole plating layer 41 since the LED 22, is encapsulated by resin 15. Consequently, bad heat dissipation capability of the substrate assembler is result.

Figure 2:
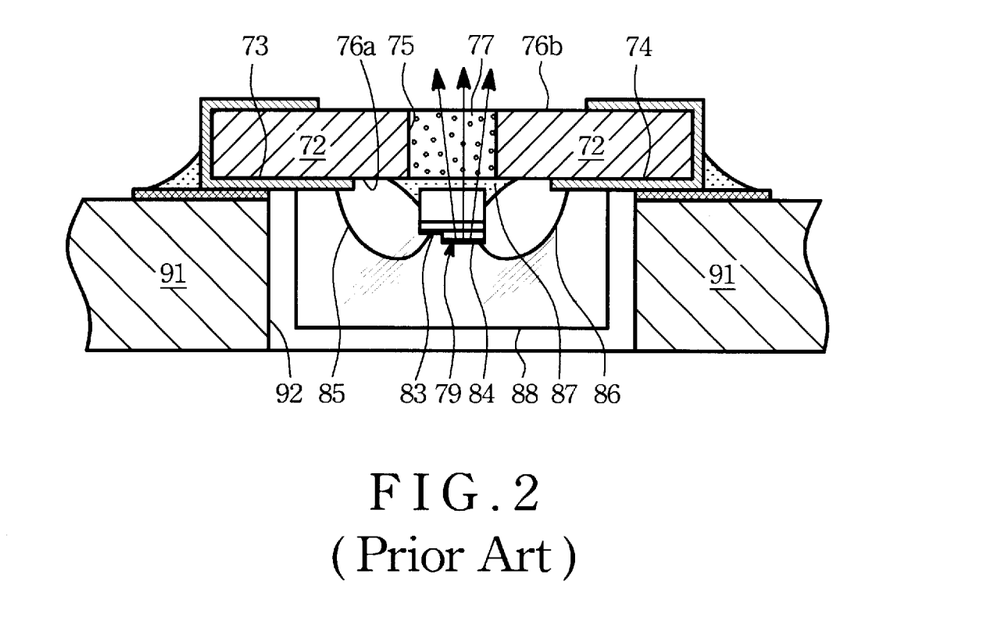
FIG. 2 shows a schematic view of a structure of a surface mount light emitting diode, which has two electrode formed on the same sides according to prior art.

The second explanatory conventional chip-type light emitting diode (LED) device is a flip-chip type disclosed in U.S. Pat. No. 6,396,082 B1, as shown in FIG. 2

The LED flip-chip 79 with a transparent substrate upward is fixed on a glass epoxy substrate 72, which has a through hole 75 formed therein directly above the LED chip 79 and two metal contacts 73, 74 on the upper surface 76a thereof extended to the lower surface 76b. The through hole 75 is filled with a transparent resin layer 77. Two metal electrodes 83, 84 on the upper surface of the LED 79 are respectively, bonded to the metal contacts 73, 74 by conductive wires 85, 86. The LED chip 79 and the conductive wires 85, 86 are then protected by a transparent sealing body 88. Finally, the glass epoxy substrate 72 is then upside down mounted onto a motherboard 91 by inserting the sealing body 88 into a hole 92 of the motherboard 91.

Since the LED is upside down and light irradiated is upward through the through hole 75 without blocking by any metal electrodes 83, 84, an excellent light emission efficiency is thus anticipated. However, owing to the insulating base substrate 72, the heat irradiated by the LED 79 can only be dissipated through the metal contacts 73, 74, since the LED 79, is encapsulated by resin 77 too. Consequently, heat dissipation capability of the substrate assembler as previous embodiment is result. The output power of LED is limited and a high power LED can't be obtained without further improvement.

An object of the present invention is thus to propose a method and structure about surface mounting for a high power LED.

SUMMARY OF THE INVENTION

The present invention discloses two surface mount techniques for high power LED chips. In the first preferred embodiments, the LED chip having two electrodes formed on the same side is mounted onto an electric & thermal conductive substrate. The method comprises the following steps:

At first the base-substrate is cut or sawed or patterned to form a plurality of trenches. The trenches are then filled with spin on glass (SOG) or polyimide or BCB (B-staged bis-benzocyclobutene; BCB) layer. Thereafter, first metal contacts are formed on the upper surface of the base substrate. For every two metal contacts, respectively, at left hand side and right hand side of each trench function to support two electrodes of the LED chip. Next, the base-substrate is then back-side milling until at least the bottom of the trenches are exposed. Afterward, second metal contacts are formed on the milled surface. The second metal contacts on the right hand side and left hand side of each trench are formed for connecting external electrodes.

Subsequently, a reflective frame assembler is adhered to the upper surface of the base-substrate. The reflective frame assembler has a plurality of reflective frame, and each of them corresponding to a LED chip.

After that, the LED chip is up-side down placed within the reflective frame and with its p-type electrode and n-type electrode mounted on a pair of the first metal contacts with solder ball or solder layer. Finally, the LED chip is sealed and protected by transparent resin or epoxy. The upper portion of the reflective frame can be optionally formed with lens shaped so as to converge the light.

The method according to the second preferred embodiment is for LED chip with two electrodes, respectively, on the different sides of the LED.

The processes are as follows:

Firstly, the conductive base-substrate is formed with a plurality of trenches therein. The trenches are then filled with SOG or polyimide. Thereafter, first metal contacts are formed on the upper surface of the base substrate. It is noted that each two first metal contacts, one on the left hand side of the trench is for connecting a bottom electrode and the other one at the right hand side is for bonding a conductive wire. Hence, the metal contacts at left hand side and right hand side of each trench are not necessary to have equal area. Next, the base-substrate is then back-side milling until at least the bottom of the trenches are exposed. Afterward, second metal contacts are formed on the milled surface. The second metal contacts on the right hand side and left hand side of each trench are formed for connecting external electrodes.

Subsequently, a reflective frame assembler is adhered to the upper surface of the base-substrate. The reflective frame assembler has a plurality of reflective frame, and each of them corresponding to a LED chip. It is noted that the central position of the reflective frame is substantially aligned with one first metal contact, which is located at the central position of the reflective frame.

After that, the LED chip is placed within the reflective frame and with bottom electrode thereof attaching the first metal contact with solder ball or solder layer, wherein the first metal contact is approximately at the central position of the reflective frame.

Subsequently, a conductive wire is bonded to the upper electrode of the LED chip and the other first metal bonding electrode. Finally, the LED chip is sealed and protected by transparent resin or epoxy. The upper portion of the reflective frame can be optionally formed with lens shaped so as to converge the light.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As forgoing description for prior art, no matter what the chip-type light emitting diodes (LEDs) packages are, all of whom are fixed onto an insulating material with metal contacts extended from upper surface to bottom surface. The insulating substrate gives bad heat dissipation path. Consequently, it will restrict the LED to a lower power.

Figure 3A:
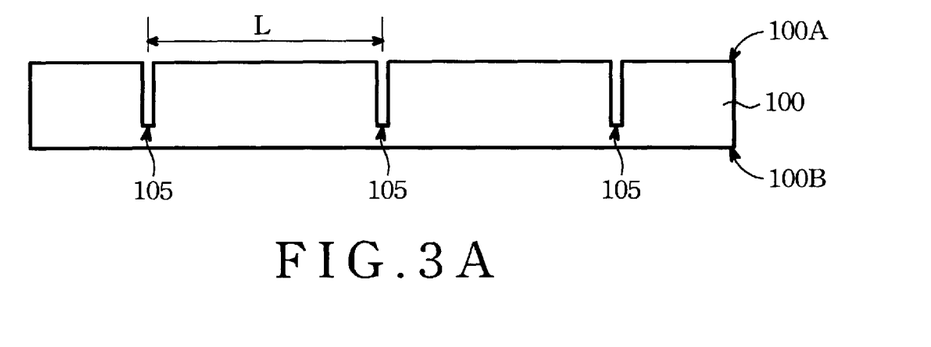
FIG. 3A is a cross-sectional view, showing an electrical & thermal base substrate formed with a plurality of trenches according to the first preferred embodiment.
Figure 3B:
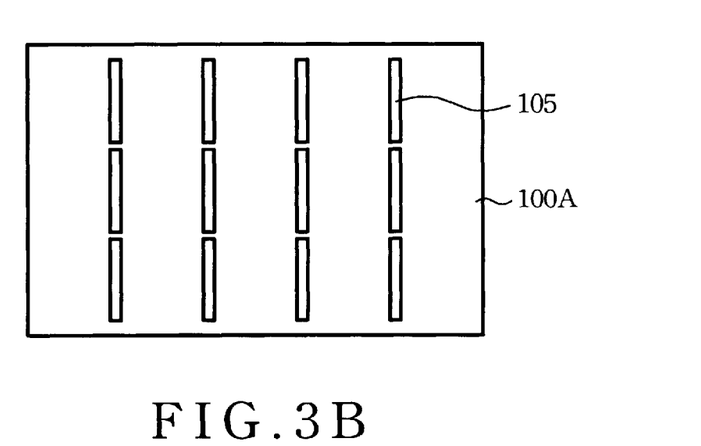
FIGS. 3B and 3C are two planar views, showing an electrical & thermal base substrate formed with two different types of trenches according to the first preferred embodiment.
Figure 3C:
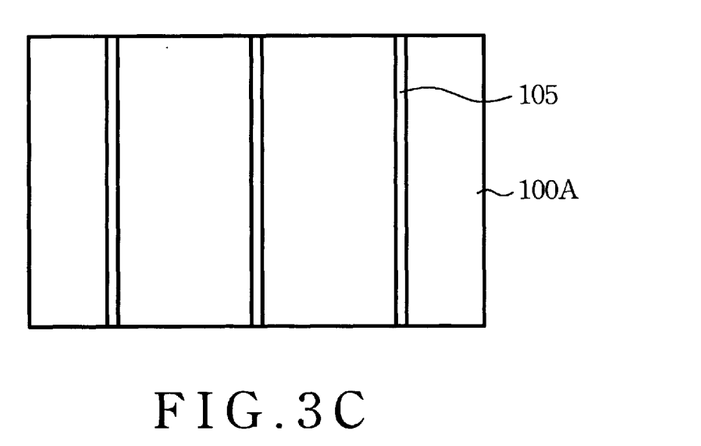
Figure 3D:
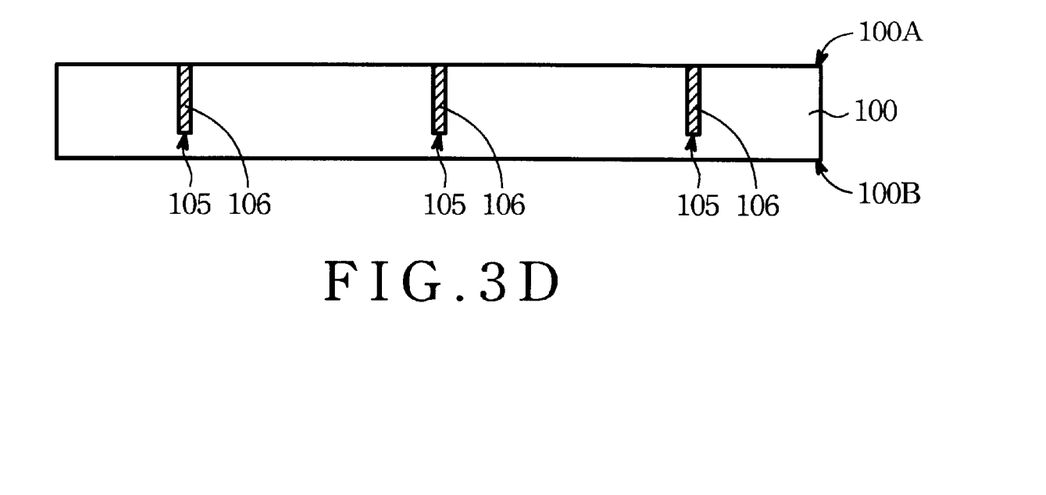
FIG. 3D is a cross-sectional view, showing an insulator is refilled the trenches according to the first preferred embodiment.
Figure 3E:
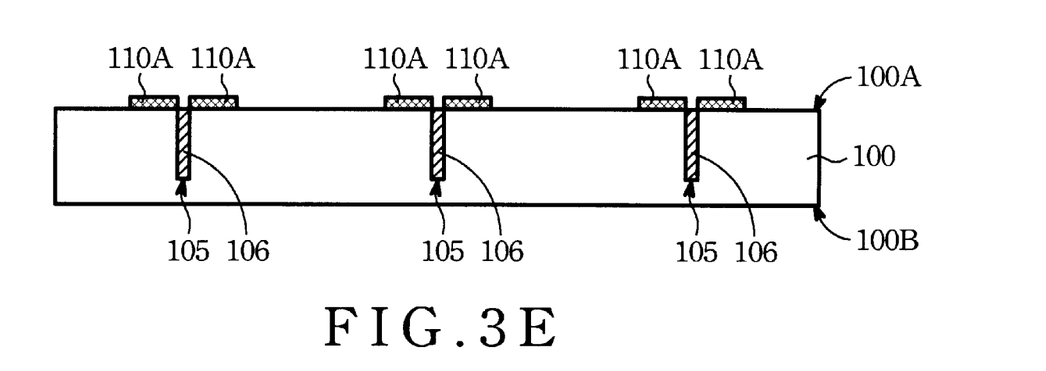
FIG. 3E is a cross-sectional view, showing first metal contacts formed on the upper surface of the base-substrate according to the first preferred embodiment.
Figure 3F:
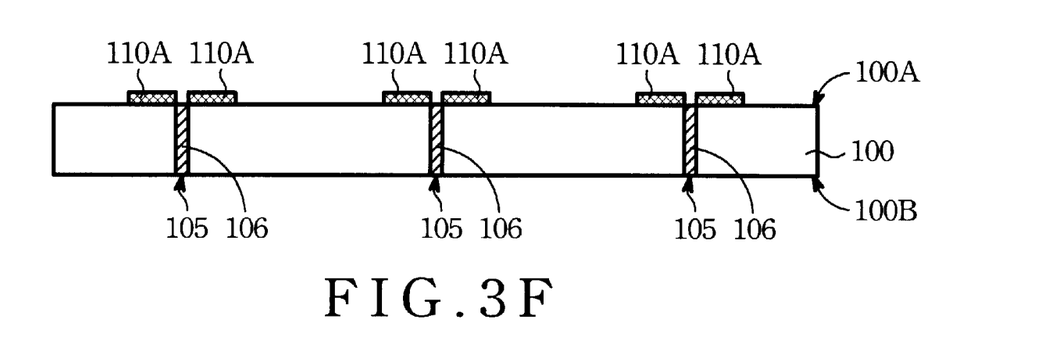
FIG. 3F showing a back-side milling is carried out until the bottom of the trench are exposed so as to isolate the base substrate at right hand side and left hand side of the trench according to the first preferred embodiment.
Figure 3G:
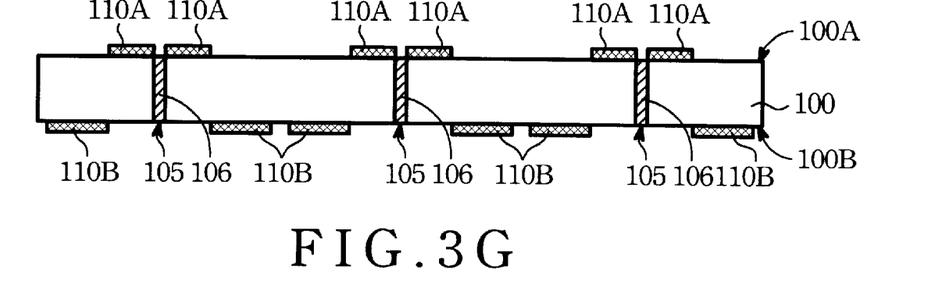
FIG. 3G showing second metal contacts are formed on the bottom surface of the base-substrate according to the first preferred embodiment.
Figure 3H:
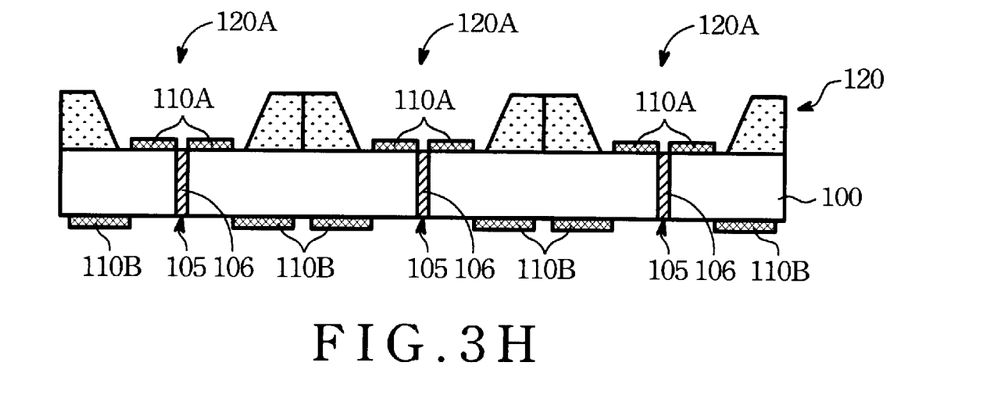
FIG. 3H showing a reflective frame assembler is adhered to the upper surface of the base-substrate, wherein said frame assembler has reflective frames each corresponding to a first metal contact pair according to the first preferred embodiment.
Figure 3I:
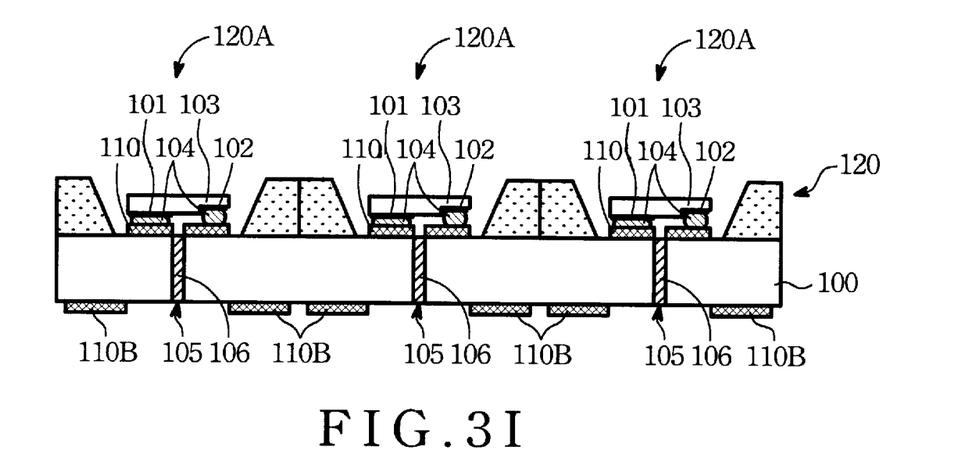
FIG. 3I showing a LED chip is placed within a corresponding reflective frame and two electrodes of each LED chip are respectively mounted to a first metal contact pair according to the first preferred embodiment.
Figure 3J:
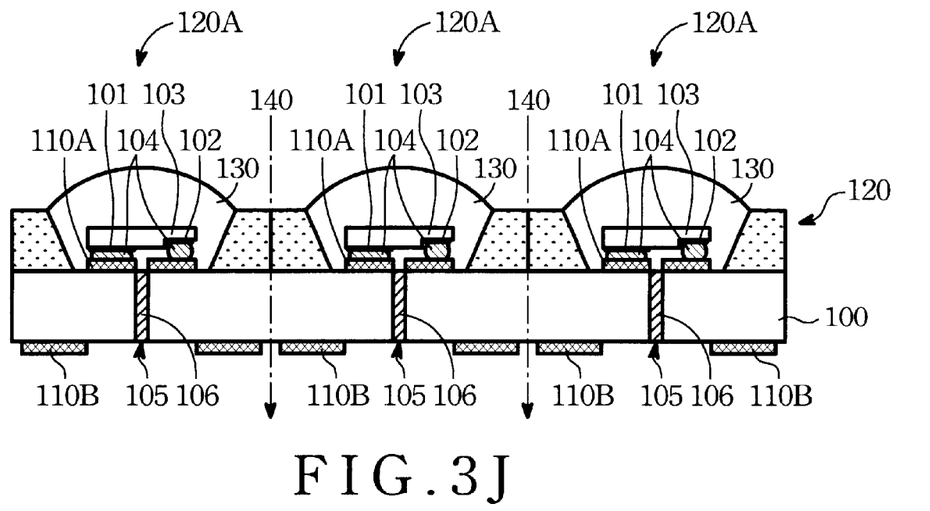
FIG. 3J showing a transparent resin or epoxy encapsulator is utilized to seal the LED chip and formed a convex lens so as to converge the light according to the first preferred embodiment.

FIG. 3J is a structure of chip-type package for high power lighti emitting diodes (LEDs) before base substrate 100 cutting according to the first preferred embodiment of the present invention. By contrast to those surface mounted package disclosed in prior art, the base substrate 100 is an electric & thermal conductive substrate and thus provides an excellent heat dissipated capability. As shown in figure, each flip-chip type of transparent substrates LED chip 103 with its p-type electrode 101 and n-type electrode 102, respectively, mounted on two first metal contacts 110A of electric & thermal conductive substrate 100. Amid them 110A, there is a trench 105 formed in between and filled with insulating material 106 thereto isolate the first metal contacts 110A on two sides of the trench 105.

The LED chip 103 is then placed within a reflective frame 120 and sealed with an resin encapsulator 130 or epoxy layer 130 and formed thereon is a convex lens for light convergence.

The surface mounting high power LEDs' processes are as follows:

Referring to FIG. 3A, a cross-sectional view, shows an electric & thermal conductive base substrate 100 formed with a plurality of trenches 105. The base substrate 100 must have high electric & thermal conductivity selected from material such as copper, aluminum, or silicon all can be selected as ideal candidate. Table 1 lists a comparison of thermal conductivity and electrical conductivity of copper, aluminum, and silicon.

TABLE 1

| | Thermal conductivity W(m-K) | Electrical conductivity (Ω-cm)$^{-1}$ |
|---|---|---|
| Copper (Cu) | 398 | 581395 |
| Aluminum (Al) | 156 | 353356 |
| Silicon (Si) | 125–150 | 100 |

Each trench 105 may have a length larger than a LED package size only or a long cut trench across the base substrate 120, as shown in plan-views FIGS. 3B and 3C, respectively. The former is formed by a lithographic and an etch process or formed by sawing or larger cutting or electrodischarge working. The pitch L between trenches is of about a LED package assembler. Worthwhile, the trenches 105 should not be cut through the base substrate 100 so as to preserve the integrity of the substrate 100. The depth of the trenches is about 100–500 μm.

Referring to FIG. 3D, an insulating layer 106 is then coated to refill the trenches 105. The material of insulating layer 106 may be selected from a SOG (spin on glass) or polyimide or BCB (B-stage bisbenzocyclobutene; BCB) layer, and the like which has characteristic of coating easily, less or free void while refilling deep trenches, and having highly thermal tolerance.

FIG. 3E shows a first metal contact layer 110A formed on two sides of each trench 105 of the base substrate. The first metal contact layer 110A is formed by deposited a metal layer onto the upper surface 100A of the base-substrate first by any conventional process such as chemical vapor deposition (CVD), sputtering, thermal evaporation or E-gun evaporation etc., and then patterned by a lithography and an etching process. Alternatively, the first metal contact layer 110A can be formed by forming a mask film first and then carried out an electroplating 100 process or electroless plating.

Thereafter, referring to FIG. 3F, a removal process is then implemented by back-side milling at least till two sides of each trench 105 are completely isolated by the insulating layer 106.

Referring to FIG. 3G, a second metal contact layer 110B is then formed on the back-side milled surface 100B of the base substrate 100. The second metal contact layer forming process is similar to the process of forming first metal contact layer 110A. However, the distance of two second metal contacts 110B on two sides of each trench 105 is distant than those of first metal contacts layer 110A. It is because the first metal contact layer 110A is formed to contact two electrodes of a LED chip 103, however, the second metal contacts layer 110B is to contact an external electrodes.

Afterward, referring to FIG. 3H, a reflective frame assembler 120 with a plurality reflective frames 120A formed therein is mounted on the upper surface 100A of the base substrate 100. The central position of each reflective frame 120A surrounded is substantially aligned with the center of the trench 105, which corresponds to the central position of the LED chip (not shown) after it fixed on the metal contacts.

FIG. 3I showing diagram of the LED is upside down and with two electrodes 101, 102, respectively mounted onto two metal contacts 110A, by solder balls or solder layer 104.

Referring to FIG. 3J, the space spanned by the reflective frame 120A is refilled by a transparent resin or epoxy layer 130 so as to protect the LED chip. Preferably, to improve the convergence and the directivity of the light from the LED, an upper portion of the transparent resin or epoxy layer is formed as a lens, which can be shaped by using a mask mold (not shown) with lens shape concaves.

Finally, still referring to FIG. 3J, the assembled substrate is diced or sliced in rectangular along cut lines 140, the x direction, and y direction (not shown).

The aforementioned surface mounting of light emitting technique using the heat & electrical conductor as base substrate can also be utilized for the light emitting element with its p-type electrode and n-type electrode, respectively, formed on the upper surface and bottom surface thereof.

Figure 4A:
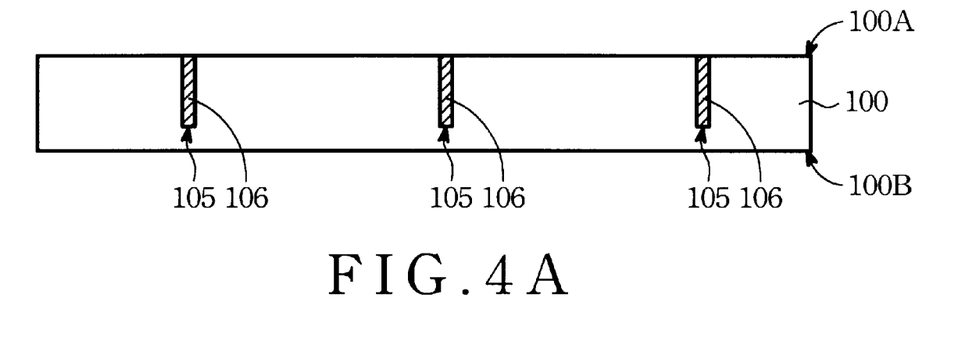
FIG. 4A showing an electrical & thermal base substrate is formed with a plurality of trenches and then the trenches is refilled with an insulator according to the second preferred embodiment.
Figure 4B:
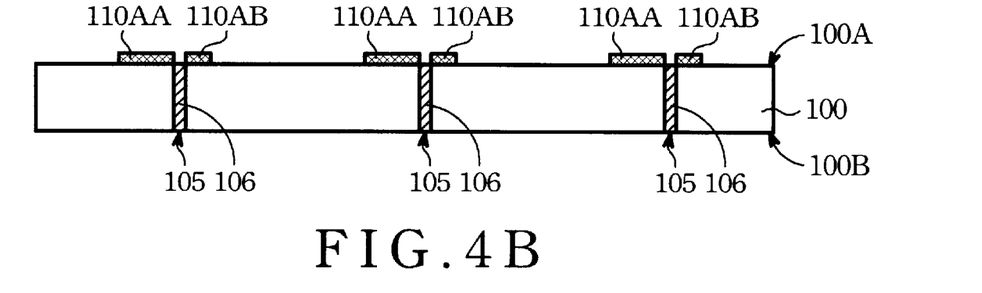
FIG. 4B showing first metal contacts are formed on the upper surface of the base substrate and then a back-side milling is performed until all the bottoms of the trenches are exposed according to the second preferred embodiment.
Figure 4C:
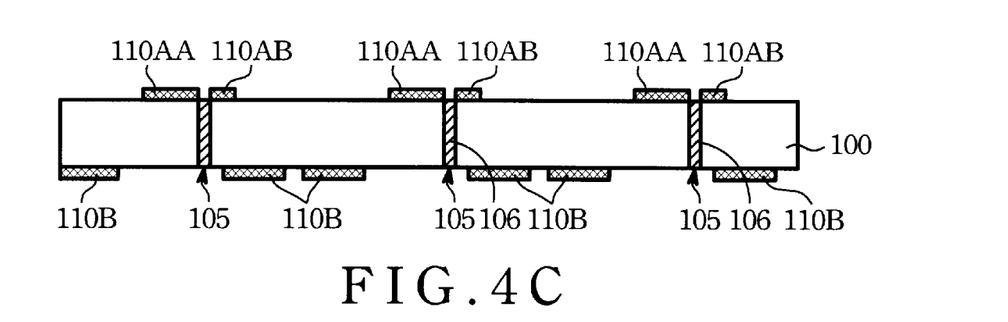
FIG. 4C showing second metal contacts are formed on the bottom surface of the base-substrate according to the second preferred embodiment.
Figure 4D:
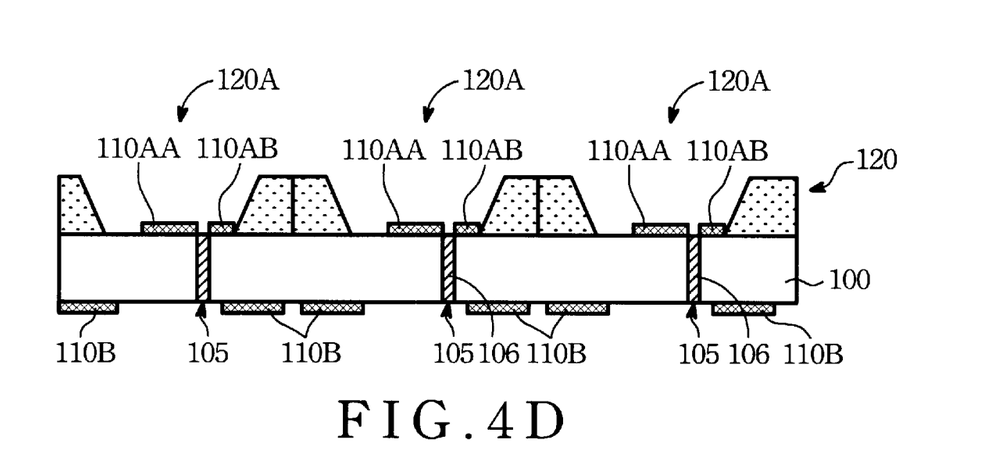
FIG. 4D showing a reflective frame assembler is adhered to the upper surface of the base-substrate, wherein said frame assembler has reflective frames each corresponding to a first metal contact pair according to the second preferred embodiment.
Figure 4E:
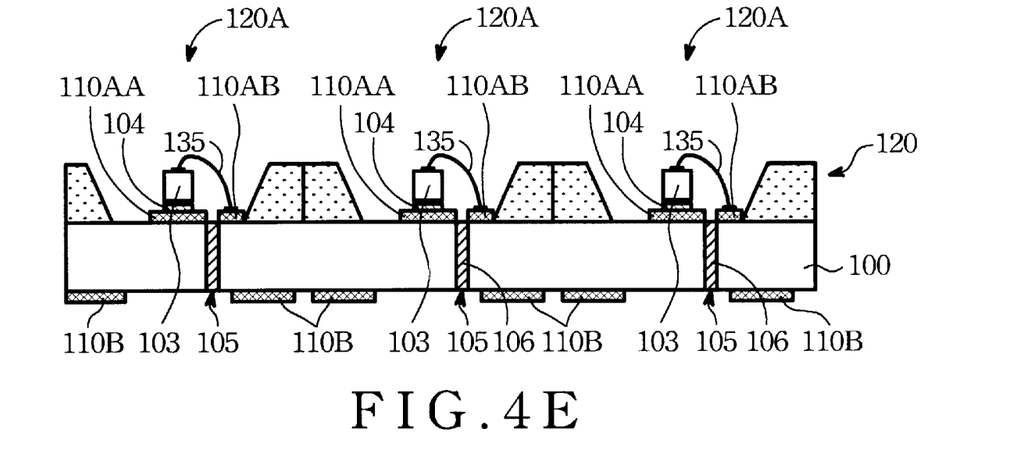
FIG. 4E showing a LED chip is placed on a first metal contact and the electrode on the upper surface of the LED chip is adhered to the other first metal contact by a wire according to the second preferred embodiment.
Figure 4F:
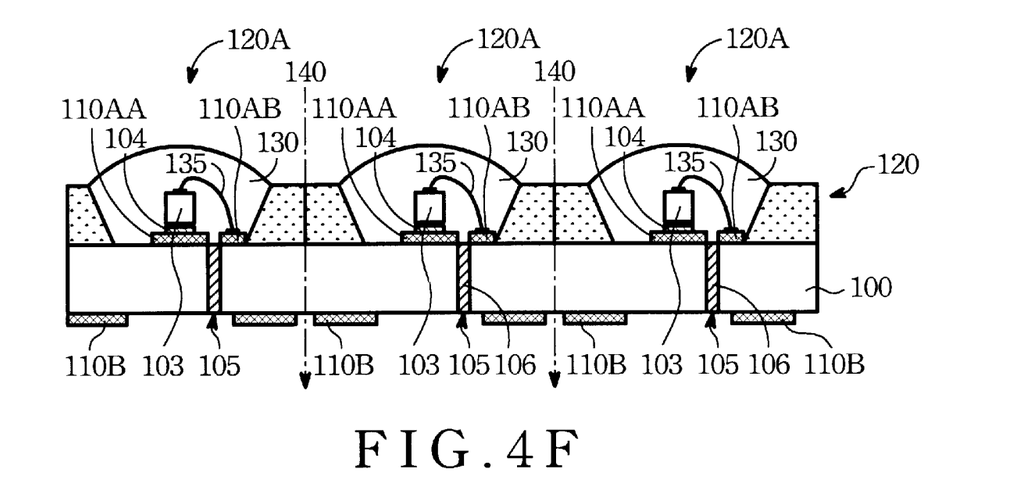
FIG. 4F showing a transparent resin or epoxy encapsulator is utilized to seal the LED chip and formed a convex lens so as to converge the light according to the first preferred embodiment.

FIG. 4F showing a diagram of a package structure for high power chip-type light emitting diodes (LEDs) before the base substrate cutting according to the second preferred embodiment. The same base-substrate 100 as the first preferred embodiment is utilized for the LED chips mounted, which has two first metal contacts 110AA, 110AB and two second metal contacts 110B respectively, formed thereon the upper 100A and the bottom surface 100B. Each LED chip 103 is with one electrode mounted onto a first metal contact 110AA. Another second metal contact 110AB on the same surface of the base-substrate 100 apart from the first one 110AA by an insulating trench 105 is for bonding the second electrode on the upper surface of the LED chip in terms of a conductive wire 135.

To make the LED chip 103 substantially located at the central position of the reflective frame 120A, the insulating trench 105 is at a position substantially off-center with respect to the reflective frame 120A. The LED chip 103 and the conductive wire 135 are then protected and sealed with a transparent resin or an epoxy layer 130. The lens is optionally formed at the upper portion of the transparent resin or the epoxy layer. The bottom surface 100B of the base-substrate 100 is also with two second-metal contacts 110B for each LED structure.

The surface mounting processes are shown in FIGS. 4A to FIG. 4G. As aforementioned preferred embodiment, the base-substrate 100 is sawed or patterned to form trenches 105. The trenches 105 are then refilled with SOG 105 or polyimide 106. The depth of the trench 105 and the pitch L therebetween are the same as previous embodiment. The result is shown in FIG. 4A.

Referring to FIG. 4B, a plurality of metal contact pairs on the upper surface of the base-substrate 100A are then formed by steps of a metal layer deposition and a patterned process or by steps of masking and then electroplating. Since one first metal contact 110AA is for a LED-chip and the other one 110AB of each metal contact pair is merely for bonding a wire, and thus optionally, one metal contact 110AA may have a larger area than the other one 110AB.

The bottom surface of the base-substrate is then backside milling until the bottom of the trenches is at least exposed. Thereafter, a plurality of metal contacts 110B is formed on the base-substrate. The results are shown in FIG. 4C.

FIG. 4D showing a diagram of a reflective frame assembler 120 having a plurality of reflective frames 120A formed therein is adhered to the upper surface 100A of the base-substrate 100. It is noted that each of the reflective frame 120A enclosed two metal contacts. However, only one of them is approximately located at the central position of the reflective frame so as to surround the light emitting element.

Referring to FIG. 4E, a LED chip 103 with an electrode on the bottom surface is placed within the reflective frame 120A and mounted on a position of the first metal contact 110AA by a metal solder layer 104. Subsequently, the other electrode on the upper surface of the LED chip 103 is boned to the other metal contact 110AB by a conductive wire 135.

Finally, a resin layer or an epoxy encapsulator 130 for sealing the LED chips 103 is injected into reflective frames, as is shown resulting diagram FIG. 4F.

Aforementioned processes for the conductive base substrate 100 with an insulating layer 106 to isolate two metal contacts 110A in the first preferred embodiment or metal contacts 110AA and 110AB in the second preferred embodiment are illustrated rather than limited the scopes of the present invention. For example, amid the conductive base substrate 100 with an insulating layer thereto isolate two parts can be formed without backside milling step. In the case, the base substrate 100 is attached with a release film on one surface. And then the sawing or etching process is conducted from the opposite surface until throughout the base substrate 100 and stopped at the release film. Thereafter, the insulating layer is coated to bond the separated parts. Finally, the release film is removed. Afterward, the followed up processes are the same.

The benefits of the present invention:

1. By contrast to those package disclosed in prior art, the base substrate 100 is an electrical and thermal conductive substrate and thus provides an excellent heat dissipated capability.
2. The manufacture processes are simpler than those of prior art. For example, no through hole drilling and through hole plating processes are demanded since the base-substrate is a conductor.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure

What is claimed is:

1. A method of surface mounting for light emitting elements having p-type electrodes and n-type electrodes thereof on one side, said method comprising the steps of:

providing an electrical and thermal conductive substrate;

forming a plurality of trenches in said substrate;

refilling said trenches with an insulating layer;

forming first metal contact pairs on an upper surface of said substrate, wherein each of said first metal contact pairs has one formed on the left hand side and the other formed on the right hand side of each of said trenches for attaching a light emitting element;

backside milling a bottom surface of said substrate until bottoms of said trenches are all exposed, and thus to isolate two first metal contacts for each first metal contact pair;

forming second metal contact pairs on said milled bottom surface, wherein each of said second metal contact pair has one formed on the left hand side and the other formed on the right hand side of each of said trenches for connecting external electrodes;

mounting a reflective frame assembler having a plurality of reflective frame therein on said upper surface, wherein each of said reflective frame corresponds to one light emitting element so that each of said first metal contact pairs has one reflective frame surrounding, and has a central position thereof aligned with a central position of said reflective frame;

placing said light emitting elements each within said reflective frame and having its p-type electrode and n-type electrode, respectively, onto said first metal contact pair which is surrounded by said reflective frame;

sealing said light emitting elements with a transparent resin or epoxy layer within said reflective frame; and separating said substrate into an individual device, wherein each device has one encapsulated light emitting element therein and has two second metal contact isolated by one trench.

2. The method of claim 1, wherein said electric & thermal conductive substrate is selected from a material selected from the group consisting of silicon, copper, and aluminum.

3. The method of claim 2, wherein each of said trenches is formed by a lithographic and an etch step to a depth of about 100–500 $\mu$m.

4. The method of claim 2, wherein each of said trenches is formed by electrodischarge working or laser cutting to a depth of about 100–500 $\mu$m.

5. The method of claim 1, wherein said insulting layer is selected from spin on glass (SOG) or polyimide or BCB (B-staged bisbenzocyclobutene.

6. A method of surface mounting for light emitting elements having p-type electrodes and n-type electrodes thereof on one side, said method comprising the steps of:

providing an electrical and thermal conductive substrate;

forming a plurality of insulating regions in said substrate, wherein each of said insulating regions is to insulate two metal contacts, which are, respectively, attached to two electrodes of a light emitting element;

forming first metal contact pairs on an upper surface of said substrate, wherein each of said first metal contact pairs, has one formed on the left hand side and the other formed on the right hand side of each of insulating regions for attaching a light emitting element;

forming second metal contact pairs on a bottom surface, wherein each of said second metal contact pair has one formed on the left hand side and the other formed on the right hand side of each of said insulating regions for connecting external electrodes;

mounting a reflective frame assembler having a plurality of reflective frame therein on said upper surface, wherein each of said reflective frame corresponds to one light emitting element so that each of said first metal contact pairs has one reflective frame surrounding, and has a central position thereof aligned with a central position of said reflective frame;

placing said light emitting elements each within said reflective frame and having its p-type electrode and n-type electrode, respectively, onto said first metal contact pair which is surrounded by said reflective frame;

sealing said light emitting elements with a transparent resin or epoxy layer within said reflective frame; and separating said substrate into an individual device, wherein each device has one encapsulated light emitting element therein and has two second metal contact isolated by one insulating region.

7. The method of claim 6, wherein said electrical and thermal conductive substrate is selected from a material selected from the group consisting of silicon, copper, and aluminum.

8. The method of claim 7, wherein said step of forming a plurality of insulating regions comprises the steps of:

attaching a release film on the first surface, of said base substrate;

forming slits in said base substrate;

refilling said slit with an insulating layer; and removing said release film.

9. The method of claim 8, wherein said step of forming slits is formed by a lithographic and an etch step until throughout said base substrate.

10. The method of claim 8, wherein said step of forming slits is formed by electrodischarge working or laser cutting until throughout said base substrate.

11. The method of claim 8, wherein said insulting layer is selected from spin on glass (SOG) or polyimide or BCB (B-staged bisbenzocyclobutene).

12. A method of surface mounting for light emitting elements having p-type electrodes and n-type electrodes thereof on different sides, said method comprising the steps of:

providing an electrical and thermal conductive substrate;

cutting a upper surface of said substrate so as to form a plurality of trenches therein;

refilling said trenches with an insulating layer;

forming first metal contact pairs on an upper surface of said substrate, wherein each of said first metal contact pairs, has one formed on the left hand side and the other formed on the right hand side of each of said trenches, and one for attaching a light emitting element, the other for bonding a conductive wire;

backside milling a bottom surface of said substrate until bottoms of said trenches are all exposed, and thus to isolate two first metal contacts for each first metal contact pair;

forming second metal contact pairs on said milled bottom surface, wherein each of said second metal contact pair has one formed on the left hand side and the other formed on the right hand side for each of said trenches for connecting external electrodes;

mounting a reflective frame assembler having a plurality of reflective frame therein on said upper surface, wherein each of said reflective frame corresponds to one light emitting element so that each of said first metal contact pairs has one reflective frame surrounding, and a central position of said reflective frame is substantially aligned with either one first metal contact that said reflective frame surrounds;

placing each one of said light emitting elements within said reflective frame corresponding by attaching its electrode on a bottom surface of said light emitting element to said first metal contact of said first metal contact pair that substantially located at a central position of reflective frame corresponding and its electrode on an upper surface of said light emitting element to the other first metal contact by a bonding wire;

sealing said light emitting element and said bonding wire with a transparent resin or epoxy layer within said reflective frame; and separating said substrate into an individual device, wherein each device has one encapsulated light emitting element therein and has two second metal electrodes isolated by one trench.

13. The method of claim 12, wherein said electrical and thermal conductive substrate is selected from a material selected from the group consisting of silicon, copper, and aluminum.

14. The method of claim 13, wherein each of said trenches is formed by a lithographic and an etch step to a depth of about 100–500 µm.

15. The method of claim 13, wherein each of said trenches is formed by electrodischarge working or laser cutting to a depth of about 100–500 µm.

16. The method of claim 12, wherein said insulating layer is selected from spin on glass (SOG) or polyimide or BCB (B-staged bisbenzocyclobutene).

* * * * *